United States Patent [19]

Yamada

[11] Patent Number: 4,712,090

[45] Date of Patent: Dec. 8, 1987

[54] DATA CONTROL CIRCUITS

[75] Inventor: Kouichi Yamada, Tokyo, Japan

[73] Assignee: NEC Corporation, Tokyo, Japan

[21] Appl. No.: 672,621

[22] Filed: Nov. 19, 1984

[30] Foreign Application Priority Data

Nov. 18, 1983 [JP] Japan ................................ 58-217323

[51] Int. Cl.$^4$ ............................................. H03M 7/00
[52] U.S. Cl. ............................... 340/347 DD; 307/242
[58] Field of Search ................ 340/347 DD; 307/242, 307/465

[56] References Cited

U.S. PATENT DOCUMENTS 3,217,147 11/1965 Chapman, Jr. ............. 340/347 M X
4,112,291 9/1978 Fukuyama et al. .............. 318/603 X Primary Examiner—T. J. Sloyan
Attorney, Agent, or Firm—Burns, Doane, Swecker & Mathis

[57] ABSTRACT

A data control circuit comprises a decoder adapted to generate weighted signals for determining the number of bits of data to be transferred; a detection circuit for detecting the output signals of the decoder to generate weighted signals corresponding to the transfer data bit number; and a propagation circuit responsive to the output signals of the detection circuit thereby to establish a propagation region where a predetermined signal propagates and a non-propagation region where the predetermined signal does not propagate and to generate from the non-propagation region the same number of activation signals as the bits of the data to be transferred.

5 Claims, 7 Drawing Figures

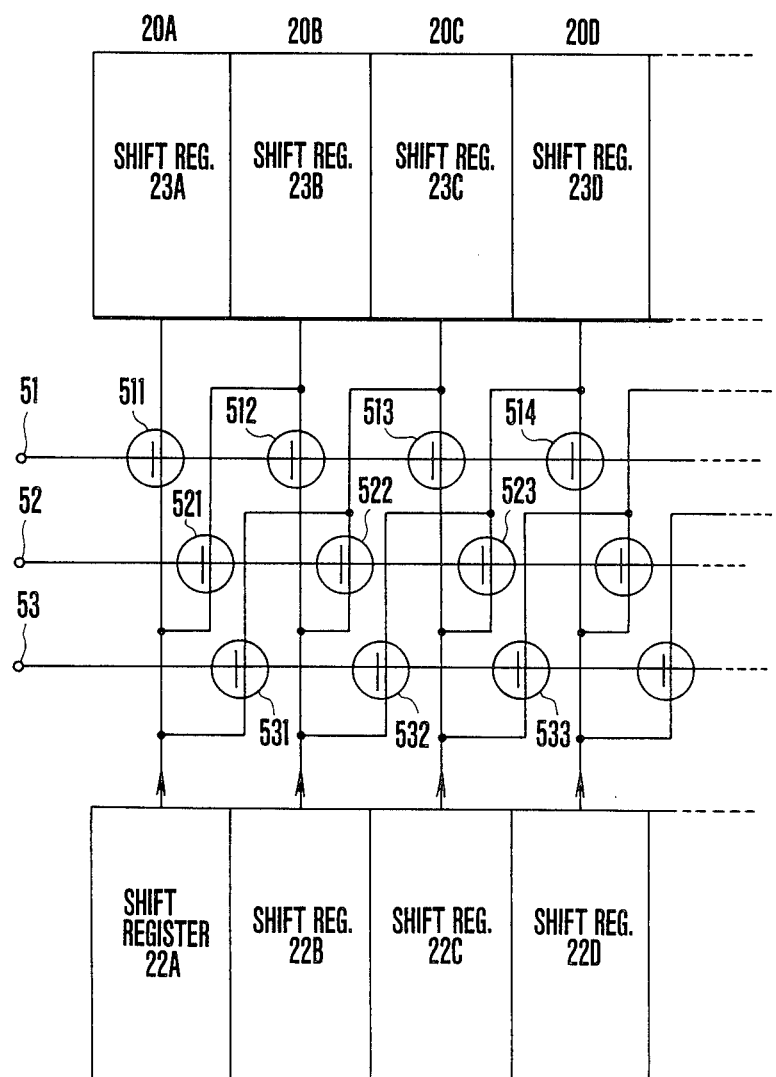
F I G. 5

DATA CONTROL CIRCUITS

BACKGROUND OF THE INVENTION

This invention relates to a data control circuit and more particularly a data control circuit suitable for use with a shifter having a plurality of bit inputs.

Recently, in data processing, transfer of a desired number of bits of data is carried out frequently. In many data processors, data of, for example, a 16-bit external memory is transferred to desired bit positions of, for example, a 64-bit/word data internal memory incorporated in the processor chip and subsequently, the transferred 16-bit data is further desired to be exchanged between addresses of the 64-bit internal memory.

FIG. 1 shows one example of a prior art data control circuit having a function to select the number of bits to be transferred. The control circuit comprises a decoder 1 issuing outputs a–f, and a plurality of OR gate circuits 2 receiving one output, two outputs,, . . . six outputs of the decoder 1, the number of which outputs is incremented by one as the number of bits increases. The outputs of the OR gate circuits 2 are designated by A –F. In particular, the decoder 1 receives a signal indicative of a bit number of data to be transferred and activates only desired output signal lines which relate to the bit number to be transferred. Thus, in the illustrated example, only one output signal line is rendered high with the remaining output signal lines rendered low.

Suppose now that an output signal c among the output signals a–f of the decoder 1 becomes high level, only output signals D, E and F among the output signals A–F of the OR gate circuits 2 become high level, whereas the other output signals A, B and C become low level. The high level output signals D, E and F determine the number of bits to be transferred. In this manner, it is possible to detect only the number of bits to be transferred so as to transfer only the necessary bits.

Although this data control circuit is advantageous in that its output delay time is short, there is a defect in that the number of inputs for each OR gate circuit increases.

FIG. 2 shows another example of the prior art data control circuit

In the same manner as in FIG. 1, a decoder 1 determines the number of bits to be transferred and activates only desired output signal lines which relate to the bit number to be transferred, among output signal lines for output signals a through f. Each OR gate circuit 3 has two inputs, one input being connected to receive one of the output signals of the decoder 1 while the other input is supplied with the output signal of the OR gate circuit of the preceding stage. The output signals of the OR gate circuits 3 are designated by A to F. Suppose now that when the output signal c of the decoder 1 becomes high level, output signals D, E and F among the output signals A to F of the OR gate circuits 3 become high level, whereas output signals A, B and C become low level. Then, the output signals D, E and F at the high level determine the number of bits to be transferred.

Although the circuit shown in FIG. 2 is advantageous in that it is possible to reduce the number of inputs of the OR gate circuits 3 over that of the circuit shown in FIG. 1, there is a defect in that the output delay of each OR gate circuit is large since the FIG. 2 circuit comprises a serial connection in which the output of one OR gate circuit of a preceding stage is supplied to the input of the other OR gate circuit of a succeeding stage.

In a presently used processor having 64 or more bits, an increase in the number of inputs of each OR gate circuit or an increase in the output delay time is a detrimental defect that prevents practical use of such a processor.

SUMMARY OF THE INVENTION

It is therefore an object of this invention to provide a novel data control circuit suitable for use in high speed processing capable of determining the number of bits to be transferred from one circuit to another and/or selecting from a data the number of bits to be manipulated without increasing the number of inputs of each gate circuit as well as the output delay time.

According to the invention, there is provided a data control circuit comprising a decoder adapted to generate weighted signals for determining the number of bits of data to be manipulated; a detection circuit for detecting the output information of the decoder to generate weighted signals corresponding to the manipulation data bit number; and a propagation circuit responsive to the output signals of the detection circuit thereby to establish a propagation region where a predetermined signal propagates and a non-propagation region where the predetermined signal does not propagate and to generate from the non-propagation region the same number of activation signals as the bits of the data to be manipulated.

BRIEF DESCRIPTION OF THE DRAWINGS

In the accompanying drawings:

FIG. 5 shows interconnection for bit shift between transmitting and receiving shift registers in a shifter group;

DESCRIPTION OF THE PREFERRED EMBODIMENT

Figure 1:
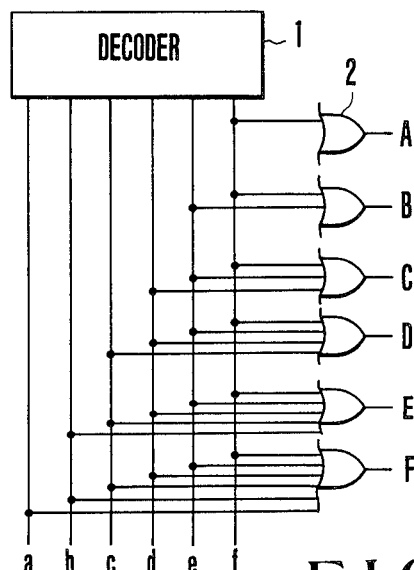
FIGS. 1 and 2 show two examples of the prior art data control circuit.
Figure 2:
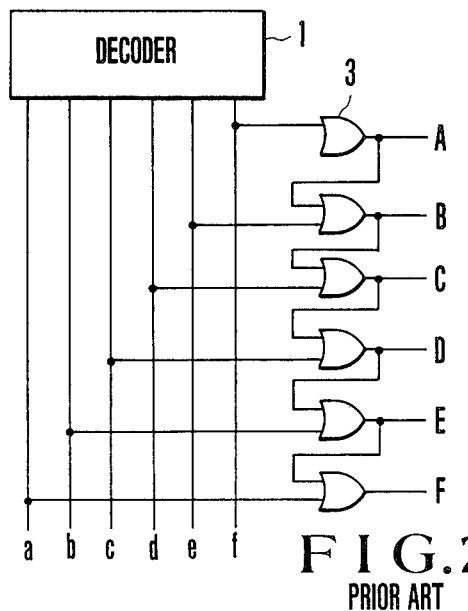
Figure 3:
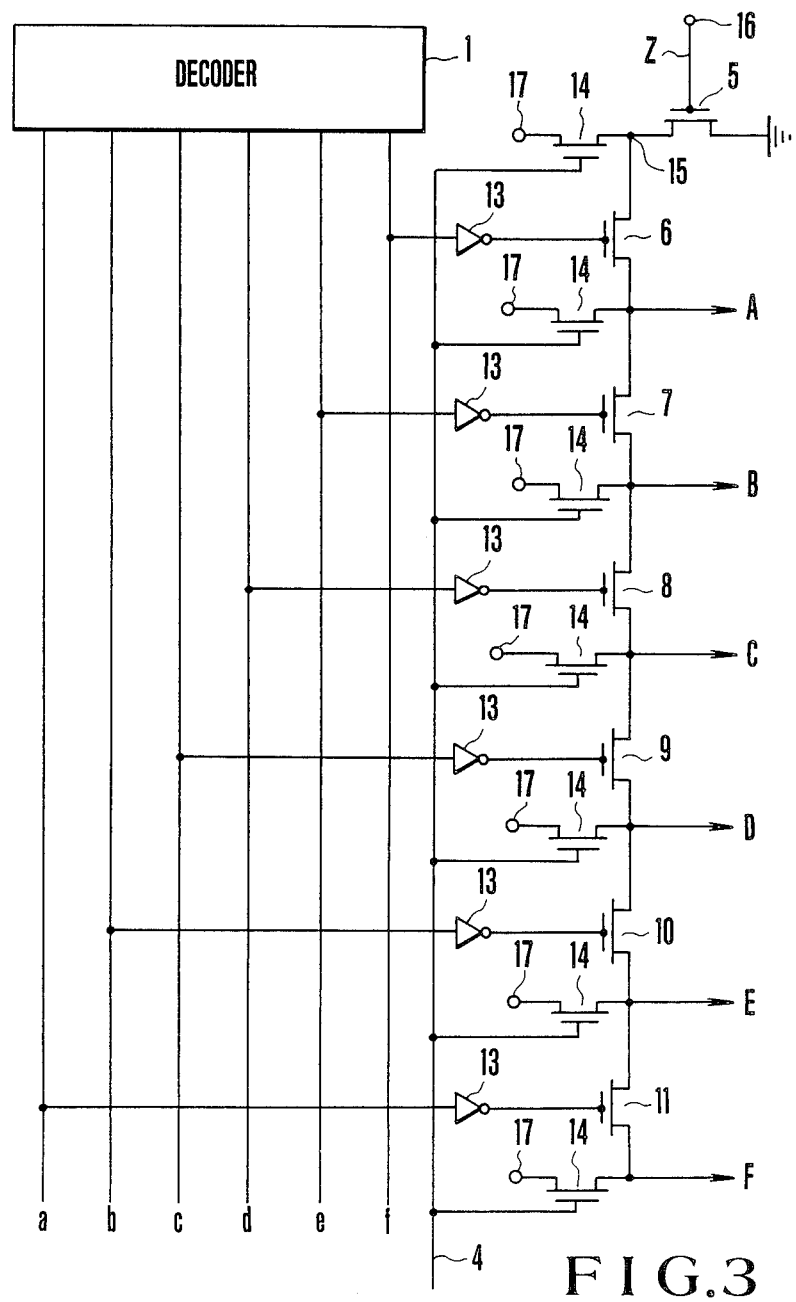
FIG. 3 is a connection diagram showing a data control circuit according to an embodiment of this invention.

A preferred embodiment shown in FIG. 3 comprises a decoder 1, similar to that shown in FIGS. 1 and 2, which provides a weighted signal that determines the number of bits of data to be transferred, a detection circuit comprised of a plurality of inverters 13 respectively receiving the output signals a to f of the decoder 1 and providing a weighted signal corresponding to the number of bits of data to be transferred, and a propagation circuit constituted by a plurality of serially connected transfer gate circuits 6 to 11 wherein the output signals of the detection circuit are applied to respective gate circuits to control a signal to be propagated to a junction 15 through the serially connected gate circuits under the control of a control switch 5. Reference numeral 14 designates a pull-up element which is pulled-up to the high level by a pull-up control signal 4. The output signals of the propagation circuit are designated by A to F. When the control switch 5 is turned ON, a predetermined signal is propagated through the serially connected gate circuits toward a predetermined level (ground level in this embodiment) so that the predetermined level is given to each transfer gate circuit.

The embodiment shown in FIG. 3 operates as follows:

Suppose now that output signal d among the output signals a to f of the decoder 1 becomes active, that is, high level, and that the bit number to be transferred is weighted by 4. Then the output of an inverter 13 supplied with the output signal d becomes low level, thereby turning OFF the transfer gate 8 of the propagation circuit. When the control switch 5 is turned ON at this time, since transfer gate circuits 6 and 7 are ON and the ground level is given to the transfer gate circuits 7 and 6, the output signals A and B of the propagation circuit become low level, whereas output signals C to F assume pulled-up high level since the propagation signal path is interrupted by the gate circuit 8 rendered OFF. In this manner, four output signals C to F at high level determine a bit range corresponding to the transfer bit number of 4. Thus, the propagation circuit is controlled by the output signals of the detection circuit thereby to establish a propagation region in this example, series-connected gates 6 and 7 where a predetermined signal propagates and a non-propagation region in this example, series-connected gates 9 to 11 where the predetermined signal does not propagate and to generate from the non-propagation region the same number of activation signals as the bits of the data to be transferred. In the same manner, when the output from the signal line f of the decoder 1 becomes high level and the transfer bit number is weighted by 6, the output signals A to F of the propagation circuit become high level, thereby determining a bit range corresponding to the transfer bit number of 6.

Figure 4:
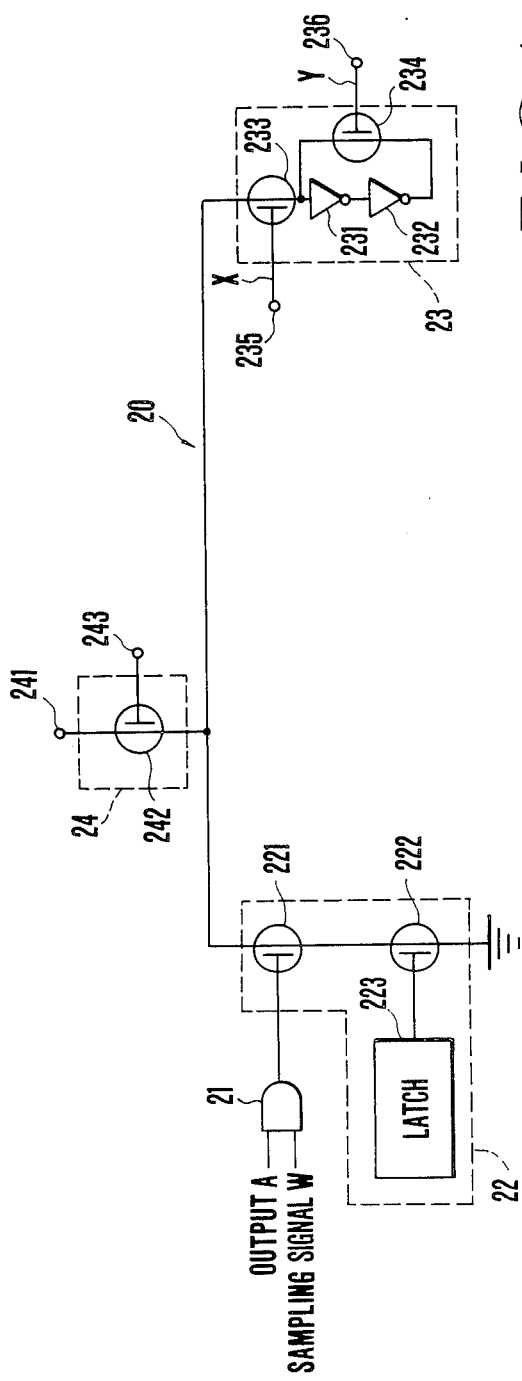
FIG. 4 is a connection diagram of a shifter used with the data control circuit.

The output signals A-F of said data control circuit are supplied respectively to one input of two-input AND gates 21 of separate but identical shifters 20 one of which for an output, the output A, for example, is shown in FIG. 4. The other input of the AND gate 21 is supplied with a sampling signal W (see FIG. 7).

A shifter 20 comprises of a shift register 22 on the transmitting side, a shift register 23 on the receiving side and a pre-charging unit 24 one end of which is connected to the transfer line connecting the shift registers 22 and 23. Power supply voltage is applied to a terminal 241. In the shift register 22, a series circuit of gates 221 and 222 of n channel, for example, made with FETs is provided, having one end grounded. The output of AND gate 21 is connected to the control electrode of the gate 221. A latch 223 of the shift register 22 stores the data to be transferred to the shift register 23. The output of the latch 223 is connected to the control electrode of the gate 222. The shift register 23 on the receiving side includes a series circuit of inverters 231 and 232 and a gate 233, and a gate 234 connected across the series-connected inverters 231 and 232. The control electrodes of the gates 233 and 234 are respectively connected to control terminals 235 and 236. The pre-charging unit 24 includes a gate 242 and the control electrode of the gate 242 is connected to a control terminal 243.

Figure 6:
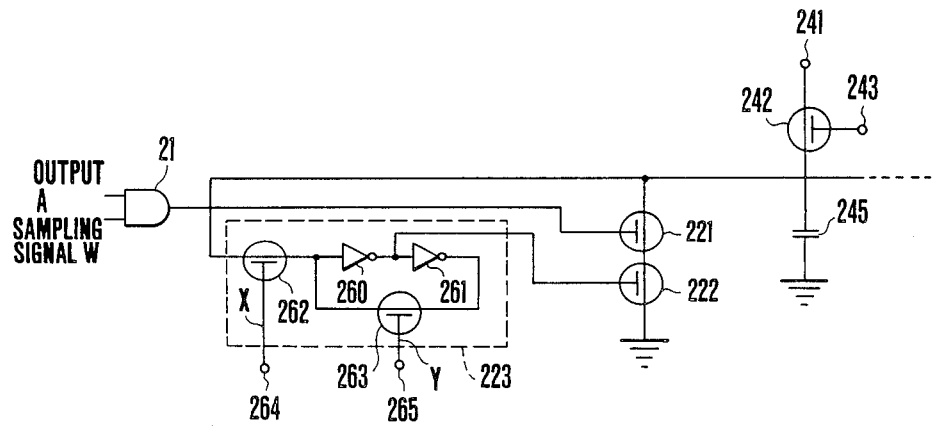
FIG. 6 is a circuit diagram of the transmitting shift register.

The latch 223 of the shift register 22 on the transmitting side is constructed substantially the same as the shift register 23 on the receiving side as shown in FIG. 6.

The output of the shift register 22 derived from a junction between series-connected inverters 260 and 261 is connected to the control electrode of the gate 222, and a gate 262 connected to the series-connected inverters 260 and 261 in series is connected to the transfer line commonly with the gate 221. A gate 263 is connected across the series-connected inverters 260 and 261. The control electrode of the gate 262 is connected to a control terminal 264, and the control electrode of the gate 263 is connected to a control terminal 265. Reference numeral 245 denotes a capacitor which is charged with the power supply voltage via the pre-charging unit 24. The electric charge pre-charged in the capacitor 245 is used also as the pull-up control signal 4 shown in FIG. 3.

Figure 7:
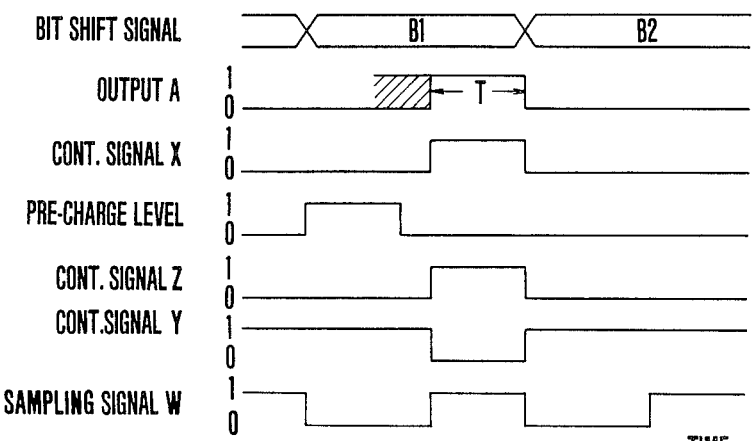
FIG. 7 is a time chart useful in explaining data transfer operation in the shifter.

FIG. 7 shows the waveforms of various control signals used for the operation of a system having a data control circuit and a shifter according to this invention. The OUTPUT A is the output A of the data control circuit supplied to the AND gate 21. The pre-charge OUTPUT A is sampled by the sampling signal W applied to the AND gate 21. The control signal supplied to the control terminal 16 shown in FIG. 3 is indicated as the CONT. SIGNAL Z, the control signal supplied to the control terminal 235 shown in FIG. 4 and control terminal 264 shown in FIG. 6 is indicated as the CONT. SIGNAL X, and the control signal supplied to the control terminal 236 shown in FIG. 4 and control terminal 265 shown in FIG. 6 is indicated as the CONT. SIGNAL Y. The pre-charge level varies in response to the control signal (not shown) supplied to the control terminal 243 shown in FIGS. 4 and 6. The BIT SHIFT SIGNAL is a signal for controlling whether to transfer the data from the shift register 22 on the transmitting side to the corresponding bit of the shift register on the receiving side or to the bit shifted by a number of bits from the corresponding bit. To briefly explain the transfer of data from the viewpoint of bit shifting, FIG. 5 shows the separate shift registers on the transmitting side respectively related to the output signals A-D shown in FIG. 3 as 22A to 22D while the shift registers on the transmitting side related to the remaining output signals E and F are omitted, and the shift registers on the receiving side corresponding to the shift registers 22A to 22D are shown respectively as 23A to 23D. Separate shifters 20A to 20D related to the outputs A to D are, therefore, constructed with respective combinations of the shift registers 22A to 22D and 23A to 23D. Data is transferred from the transmitting side to the receiving side in a parallel manner according to the data transfer operation explained later. As a BIT SHIFT SIGNAL is supplied alternatively to a control terminal 51 connected commonly to the control electrodes of gates 511 to 514, a control terminal 52 connected commonly to the control electrodes of gates 521 to 523 or a control terminal 53 connected commonly to the control electrodes of gates 531 to 533, bit shifting of the data to be transferred can be effected. To be more specific, when a signal "1" is supplied to the control terminal 51 for 0-bit shifting, only the gates 511 to 514 are turned ON and the data of the respective shift registers 22A to 22D are transferred to the respective, corresponding shift registers 23A to 23D. When the signal "1" is supplied to the control terminal 52 for 1-bit shifting, the gates 521, 522 . . . are turned ON and the data of the respective shift registers 22A to 22D are transferred to the respective, 1-bit shifted shift registers 23B, 23C, 23D and 23E(not shown). Similarly, when the signal "1" is supplied to the control terminal 53 for 2-bit shifting, the data of the respective shift registers 22A to 22D are transferred to the respective, 2-bit shifted shift registers 23C, 23D, 23E(not shown) and 23F(not shown) via the gates 531, 532 . . . .

The data transfer operation will now be explained with reference to FIG. 7. During the presence of a predetermined BIT SHIFT SIGNAL $B_1$, the gate 242 of the pre-charging unit 24 is first turned ON and the capacitor 245 is charged by the power supply voltage supplied to the terminal 241, to raise the pre-charge level high. Simultaneously, the pull-up control signal 4 shown in FIG. 3 grows high. Incidentally, the terminal 17 shown in FIG. 3 is constantly connected to the power supply voltage. Supposing at this time that the output of the shift register 22 on the transmitting side is "1" and the output signal A is sampled by the sampling signal W, the high output signal A is supplied via the AND gate 21. At the same time the control signal Z of the control terminal 16 shown in FIG. 3 is raised to turn ON the gate 221. Since the gate 222 is ON, the electric charge in the capacitor 245 is discharged via the gates 221 and 222. Concurrently, due to the control signal X being high and the control signal Y being low, the gates 262 and 235 of the shift registers 22 and 23 on the transmitting and receiving sides are turned ON, whereby the data "1" of the shift register 22 on the transmitting side is transferred to the shift register 23 on the receiving side as "0".

Likewise, in the case the output of the shift register on the transmitting side is "0" and the output A is sampled, the data "0" of the shift register on the transmitting side is transferred to the shift register on the receiving side as "1". A similar operation takes place during the presence of the BIT SHIFT SIGNAL B2. The delay on account of the above-explained data transfer operation is T, the duration of the sampling signal W, at the most, which is with a great reduction compared with the delay caused by the prior art, series-connected OR-gates shown in FIG. 2.

As described above, according to this invention, the output signals of a decoder weighted corresponding to the transfer bit number are detected by detection circuit for detecting the bit length to be transferred. The output of the detection circuit is inputted to a propagation circuit to bring the output number corresponding to the transfer bit number to high level so as to determine a bit range to be transferred. Accordingly, it is possible to provide an improved data control circuit capable of processing at a high speed without increasing the number of inputs per one gate circuit and without increasing the output delay time.

What is claimed is:

1. A circuit for encoding an output signal of a decoder which has N output signal lines, one of the N output signal lines being at a first voltage level in accordance with decoded information, the remaining output signal lines being at a second voltage level different from said first voltage level, comprising:
a first circuit having N transistors connected in series;
means for coupling an input electrode of each of said transistors to a corresponding output signal line of said decoder;
N output terminals, each of which is connected to a respective transistor of said first circuit;
means coupled to said N output terminals for charging each of the N output terminals to the first voltage level during a precharge cycle; and
a discharge means coupled to said first circuit for discharging at least one output terminal from the first voltage level to the second voltage level during a discharge cycle such that, during the discharge cycle, only the transistor coupled to the output signal line at the first voltage level is turned off while the remaining transistors are turned on, so that output terminals between the turned off transistor and said discharge means are at the second voltage level, and the remaining output terminals are at the first voltage level.

2. A circuit as claimed in claim 1, wherein the N output terminals are charged to the first voltage level at the same time before a decoding operation is performed, and said discharge means is activated after the decoding operation has been terminated.

3. A circuit as claimed in claim 1, wherein said discharge means has a discharge transistor having one end which is coupled to said first circuit and another end coupled to a voltage source with the second voltage level, said discharge transistor being turned on during the discharge cycle.

4. A circuit as claimed in claim 1, wherein each input electrode of said N transistors is coupled to the corresponding output signal line via an inverter.

5. A circuit as claimed in claim 1, wherein said decoder produces a weighted signal having the first voltage level at one of the N output signal lines, and only the output terminals corresponding in number to the weighted signal are at the first voltage level.

* * * * *